US011482282B2

(12) United States Patent
Wang et al.

(10) Patent No.: US 11,482,282 B2
(45) Date of Patent: Oct. 25, 2022

(54) MEMORY DEVICE AND OPERATION METHOD THEREOF

(71) Applicant: MACRONIX INTERNATIONAL CO., LTD., Hsinchu (TW)

(72) Inventors: Yun-Yuan Wang, Kaohsiung (TW); Dai-Ying Lee, Hsinchu County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 17/191,944

(22) Filed: Mar. 4, 2021

(65) Prior Publication Data

US 2022/0284952 A1 Sep. 8, 2022

(51) Int. Cl.
*G11C 11/00* (2006.01)
*G11C 13/00* (2006.01)
*H03K 19/20* (2006.01)

(52) U.S. Cl.
CPC .......... *G11C 13/003* (2013.01); *G11C 13/004* (2013.01); *H03K 19/20* (2013.01); *G11C 2213/79* (2013.01)

(58) Field of Classification Search
CPC .. G11C 13/003; G11C 13/004; G11C 2213/79
USPC .......................................................... 365/148
See application file for complete search history.

(56) References Cited

U.S. PATENT DOCUMENTS 6,556,507 B2 4/2003 Toda et al.
11,050,426 B1 * 6/2021 Loy ........................ H03K 19/20
2015/0171868 A1 * 6/2015 Rodriguez ..... H03K 19/017581 326/38
2016/0020766 A1 * 1/2016 Miao ................. H03K 19/0021 326/37
2018/0159536 A1 * 6/2018 Swartzlander ..... G11C 13/0069
2020/0372331 A1 11/2020 Chang et al.

FOREIGN PATENT DOCUMENTS

TW 439064 B 6/2001
TW 202044122 A 12/2020

OTHER PUBLICATIONS

Wald, E. G. Friedman, A. Kolodny and U. C. Weiser, "Memristor-Based Material Implication (IMPLY) Logic: Design Principles and Methodologies,"; IEEE Transactions on Very Large Scale Integration (VLSI) Systems, vol. 22, No. 10, Oct. 2014; pp. 2054-2066.

* cited by examiner

*Primary Examiner* — Vu A Le
(74) *Attorney, Agent, or Firm* — McClure, Qualey & Rodack, LLP

(57) ABSTRACT

A memory device and an operation method thereof are provided. The memory device comprises: a memory array including a plurality of memory cells; a plurality of bit lines coupled to the memory array; a plurality of word lines coupled to the memory array; and a plurality of conductance controllable units coupled to the memory array; wherein a memory cell group and at least one conductance controllable unit among the conductance controllable units form a logic operation unit, and a logic operation function of the logic operation unit is determined by an equivalent conductance of the at least one conductance controllable unit.

19 Claims, 16 Drawing Sheets

A
B
Y
T4
C
RW

MEMORY DEVICE AND OPERATION METHOD THEREOF

TECHNICAL FIELD

The disclosure relates in general to a memory device having CIM (Computing in Memory) function and an operation method thereof.

BACKGROUND

CIM (Computing in Memory) may be used in AI (Artificial intelligence) accelerator structure. Data operations are performed in the CIM memory device and the operation results are output to the processor. Thus, by comparison, CIM may have advantages, such as, lowered power consumption, improved operation efficiency, and thus is suitable in implementing AI in user terminal.

In order to further reduce power consumption and improve integrability, resistive switches are used to implement logic operation units having CIM function. Different voltages are applied to switch the logic operation function of the logic operation unit. However, multi-voltage operation structure will increase processing procedure complexity and peripheral circuit complexity.

SUMMARY

According to one embodiment, a memory device is provided. The memory device comprises: a memory array including a plurality of memory cells; a plurality of bit lines coupled to the memory array; a plurality of word lines coupled to the memory array; and a plurality of conductance controllable units coupled to the memory array; wherein a memory cell group and at least one conductance controllable unit among the conductance controllable units form a logic operation unit, and a logic operation function of the logic operation unit is determined by an equivalent conductance of the at least one conductance controllable unit.

According to another embodiment, provided is an operation method for a memory device, the operation method comprising: selecting a memory cell group of a plurality of memory cells of the memory device and at least one conductance controllable unit to form a logic operation unit; and controlling an equivalent conductance of the at least one conductance controllable unit to determine a logic operation function of the logic operation unit.

Figure 1A:
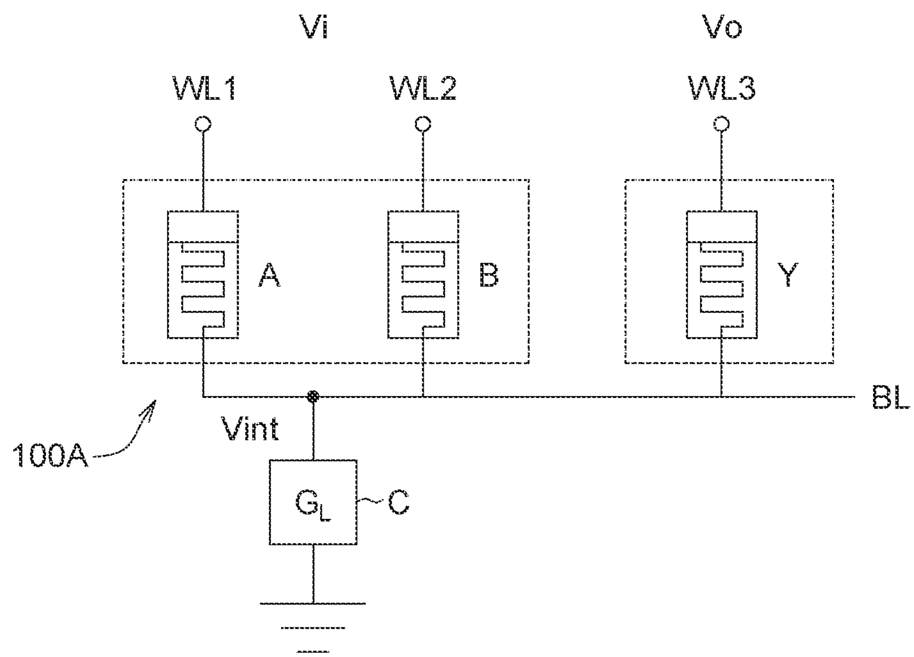
FIG. 1A and FIG. 1B show two kinds of circuit structures of the logic operation units of a memory device according to two embodiments of the application.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DESCRIPTION OF THE EMBODIMENTS

Technical terms of the disclosure are based on general definition in the technical field of the disclosure. If the disclosure describes or explains one or some terms, definition of the terms is based on the description or explanation of the disclosure. Each of the disclosed embodiments has one or more technical features. In possible implementation, one skilled person in the art would selectively implement part or all technical features of any embodiment of the disclosure or selectively combine part or all technical features of the embodiments of the disclosure.

Figure 1B:
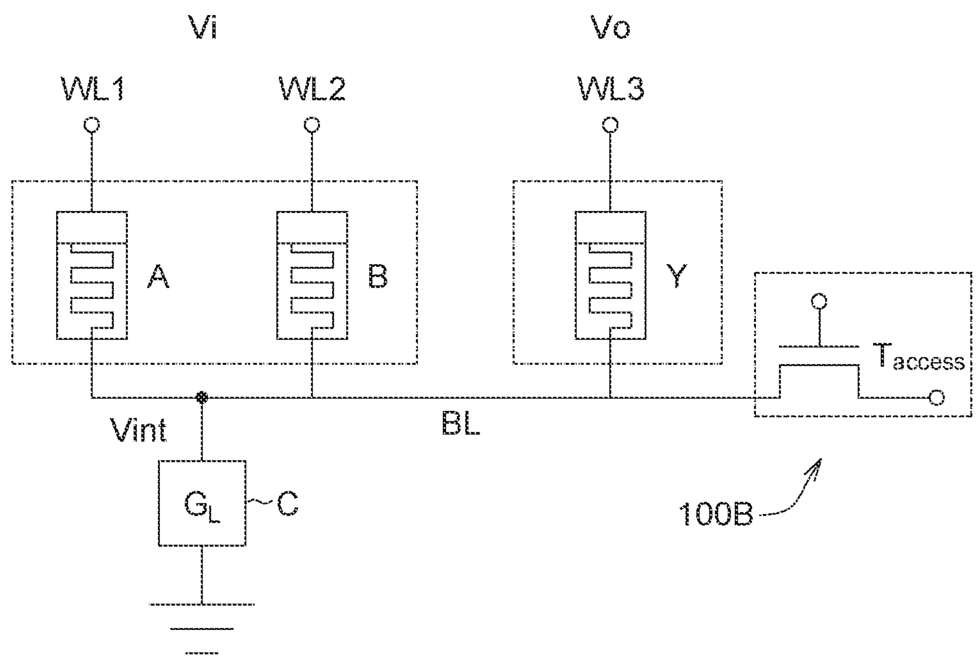

Now refer to FIG. 1A and FIG. 1B, which show two kinds of circuit structures of the logic operation units of a memory device according to two embodiments of the application.

In FIG. 1A, the logic operation unit 100A includes: resistive switches A, B and Y, and a conductance controllable unit C.

The resistive switches A, B and Y are parallel. The resistive switch A includes one terminal coupled to a word line WL1 and another terminal coupled to a bit line BL. The resistive switch B includes one terminal coupled to a word line WL2 and another terminal coupled to the bit line BL. The resistive switch Y includes one terminal coupled to a word line WL3 and another terminal coupled to the bit line BL. The conductance controllable unit C includes one terminal coupled to the bit line BL and another terminal coupled to ground.

In FIG. 1B, the logic operation unit 100B includes: resistive switches A, B and Y, a conductance controllable unit C and an access transistor Taccess. The access transistor Taccess is optional in embodiments of the application.

The access transistor Taccess includes one terminal (for example, a drain terminal) coupled to the bit line BL, another terminal (for example, a source terminal) coupled to a sensing amplifier (not shown) and a control terminal (for example, a gate terminal) for receiving a gate control voltage (not shown). The access transistor Taccess provides a reading current or a reading voltage, to read or change the conductance state of the resistive switches.

In embodiments of the application, as shown in FIG. 1A and FIG. 1B, via changing an equivalent conductance of the conductance controllable unit C, the operation functions of the logic operation units 100A and 100B are controlled. Here, the operation functions of the logic operation units 100A and 100B include, for example but not limited by, NAND logic operations and NOR logic operations.

In one embodiment of the application, when the conductance controllable unit C has a first equivalent conductance, the operation functions of the logic operation units 100A and 100B are controlled as NAND logic operations; and when the conductance controllable unit C has a second equivalent conductance, the operation functions of the logic operation units 100A and 100B are controlled as NOR logic operations. The first equivalent conductance is higher than the second equivalent conductance. For example but not limited by, the first equivalent conductance is double of the second equivalent conductance.

In one embodiment of the application, the resistive switches A and B also refer as the input cells for storing input data before logic operations; and the resistive switch Y also refers as the output cell(s) for storing output data obtained after logic operations.

Further, the resistive switches A, B and the conductance controllable unit C form a voltage divider which determines the bit line voltage Vint on the bit line BL and determines the final stage of the resistive switch Y. Details are as below.

Figure 2:
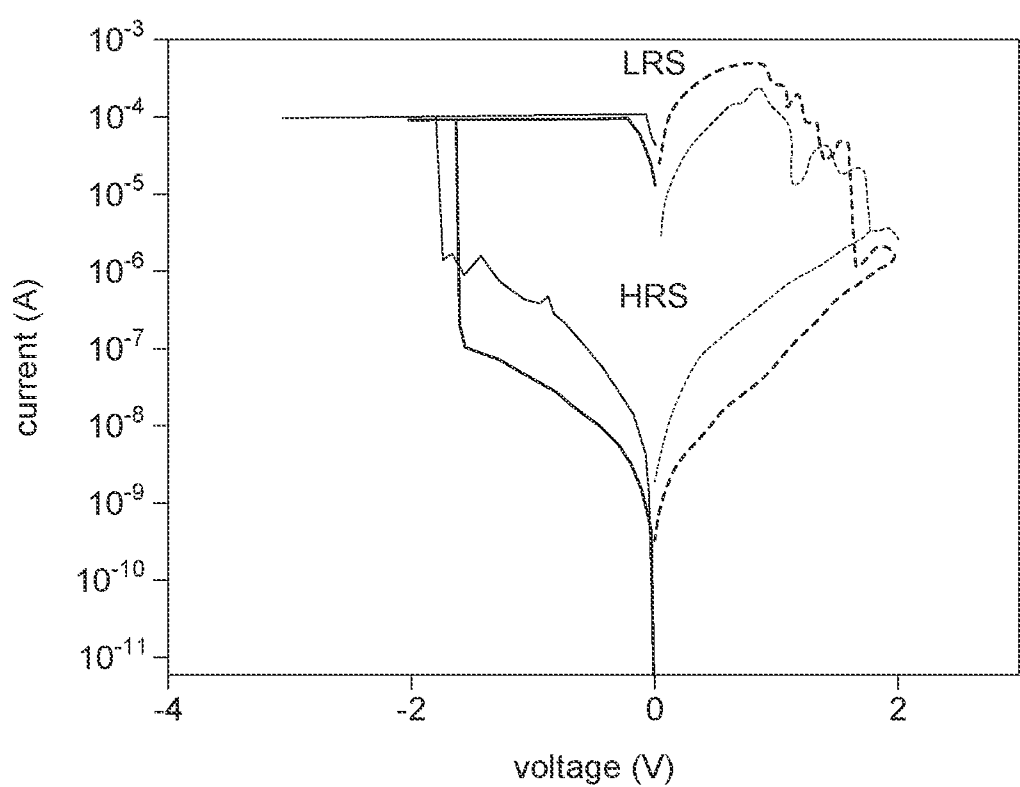
FIG. 2 shows voltage-current characteristic figure of the resistive switch according to one embodiment of the application.

FIG. 2 shows voltage-current characteristic figure of the resistive switch according to one embodiment of the application. As shown in FIG. 2, when the voltage drop of the resistive switch exceeds a set voltage VSET, the resistive switch is programmed (changed) from a high resistance state (HRS) into a low resistance state (LRS). On the contrary, when the reverse voltage drop of the resistive switch exceeds a reset voltage, the resistive switch is programmed (changed) from the LRS to the HRS.

In one embodiment of the application, the LRS state and the HRS stage of the resistive switch is, for example but not limited by, defined as logic 1 and logic 0, respective. $G_{HRS}$ and $G_{LRS}$ refer to the conductance value of the resistive switch as the HRS and LRS, respectively, wherein $G_{HRS} << G_{LRS}$.

In FIG. 1A and FIG. 1B, the input voltage Vi is applied to the word lines WL1 and WL2. That is, the input voltage Vi is applied to the resistive switches A and B. The output voltage Vo is applied to the word line WL3. That is, the output voltage Vo is applied to the resistive switch Y. Still further, the resistive switch Y has an initial state of HRS.

By voltage division rule, the bit line voltage Vint is expressed as below.

When the resistive switches A and B are both at LRS, the bit line voltage Vint is expressed as: Vint=Vi*($G_{LRS}$)/($G_{LRS}$+0.5 $G_L$), wherein "$G_L$" refer to the conductance value of the conductance controllable unit C.

When one among the resistive switches A and B is at LRS while the other one among the resistive switches A and B is at HRS, the bit line voltage Vint is expressed as: Vint=Vi*($G_{LRS}$)/($G_{LRS}$+$G_L$).

When the resistive switches A and B are both at HRS, the bit line voltage Vint is expressed as: Vint=0V.

When the resistive switch Y is to be programmed, the voltage drop of the resistive switch Y is to be higher than the set voltage VSET. In other words, when a difference vale (Vo−VSET) between the output voltage Vo and the set voltage VSET is higher than the bit line voltage Vint, the resistive switch Y is programmed (from HRS into LRS).

Nand Logic Operations

In one embodiment of the application, in the case that the difference vale (Vo−VSET) between the output voltage Vo and the set voltage VSET is between "Vi*(Gus)/($G_{LRS}$+0.5$G_L$)" and "Vi*($G_{LRS}$)/($G_{LRS}$+$G_L$)", then (1) when at least one among the resistive switches A and B is at HRS, the resistive switch Y is programmed into LRS (Y=0); (2) when the resistive switches A and B are both at LRS, the resistive switch Y is not programmed (the resistive switch Y is at HRS, and Y=1).

In other words, in this case, the logic states of the resistive switches A, B and Y are as below:

| A | B | Y |
|---|---|---|
| 0 | 0 | 1 |
| 0 | 1 | 1 |
| 1 | 0 | 1 |
| 1 | 1 | 0 |

Thus, in this case, the operation function of the logic operation units 100A and 100B is NAND logic operations.

Nor Logic Operations

In one embodiment of the application, in the case that the difference vale (Vo-VSET) between the output voltage Vo and the set voltage VSET is between "Vi*($G_{LRS}$)/($G_{LRS}$+$G_L$)" and "0V", then (1) when the resistive switches A and B are both at HRS, the resistive switch Y is programmed into LRS (Y=0); (2) when one among the resistive switches A and B is at HRS and the other one among the resistive switches A and B is at LRS, the resistive switch Y is not programmed (the resistive switch Y is at HRS, and Y=1); and (3) when the resistive switches A and B are both at LRS, the resistive switch Y is not programmed (the resistive switch Y is at HRS, and Y=1).

In other words, in this case, the logic states of the resistive switches A, B and Y are as below:

| A | B | Y |
|---|---|---|
| 0 | 0 | 1 |
| 0 | 1 | 0 |
| 1 | 0 | 0 |
| 1 | 1 | 0 |

Thus, in this case, the operation function of the logic operation units 100A and 100B is NOR logic operations.

Still further, in order to make a maximum gap between "Vi*($G_{LRS}$)/($G_{LRS}$+0.5$G_L$)" and "Vi*($G_{LRS}$)/($G_{LRS}$+$G_L$)" for better operation results, the conductance value "$G_L$" of the conductance controllable unit C is set as $G_L=\sqrt{2}G_{LRS}$, but the application is not limited by this. The conductance value "$G_L$" of the conductance controllable unit C may be set as other proper values.

Thus, in one embodiment of the application, when $G_L=\sqrt{2}G_{LRS}$ ($G_L$ is set as a preferred value), the voltage difference (Vo−VSET) is expressed as Vo−VSET=(½)*Vi, but the application is not limited by. When at least one among the resistive switches A and B is at HRS, the resistive switch Y is programmed, in other words, the logic operation units 100A and 100B has NAND logic operation function.

In case that the conductance value "$G_L$" of the conductance controllable unit C is set as a half of the preferred value ($G_L=(1/\sqrt{2})*G_{LRS}$), when the resistive switches A and B are both as HRS, the resistive switch Y is programmed, in other words, the logic operation units 100A and 100B has NOR logic operation function.

Thus, in one embodiment of the application, via controlling the conductance value "$G_L$" of the conductance controllable unit C, the logic operation units 100A and 100B are switched between NAND logic operation and NOR logic operation.

Now refer to FIG. 3A to FIG. 3E, which show several possible embodiments of the conductance controllable unit C.

Figure 3A:
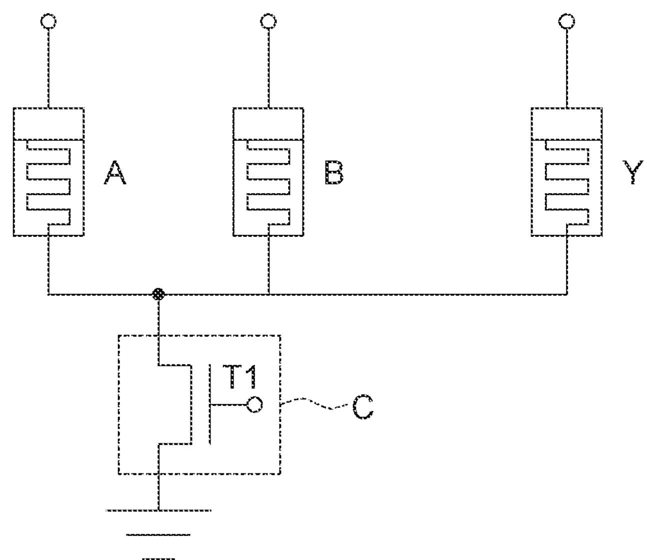
FIG. 3A to FIG. 3E show several possible embodiments of the conductance controllable unit.

In FIG. 3A, the conductance controllable unit C includes a transistor T1. In FIG. 3A, the transistor T1 is at the linear region to adjust the equivalent conductance of the conductance controllable unit C. Higher the gate voltage applied to the gate of the transistor T1, lower the equivalent conductance of the conductance controllable unit C; and vice versa.

Figure 3B:
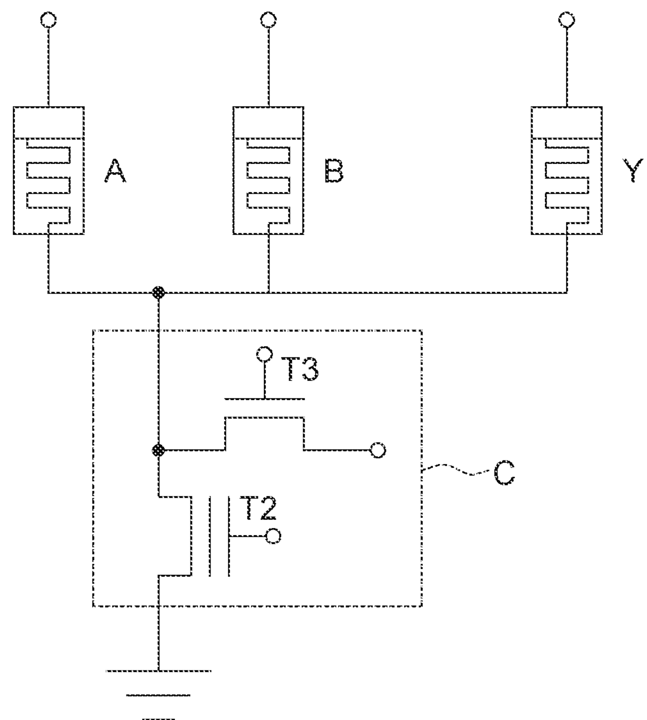

In FIG. 3B, the conductance controllable unit C includes a floating-gate transistor T2 and a transistor T3. In FIG. 3B, the transistor T3 provides a drain current to program or erase the floating-gate transistor T2, for changing the equivalent conductance value of the floating-gate transistor T2 at the linear region. During logic operation, the transistor T3 is turned off.

Figure 3C:
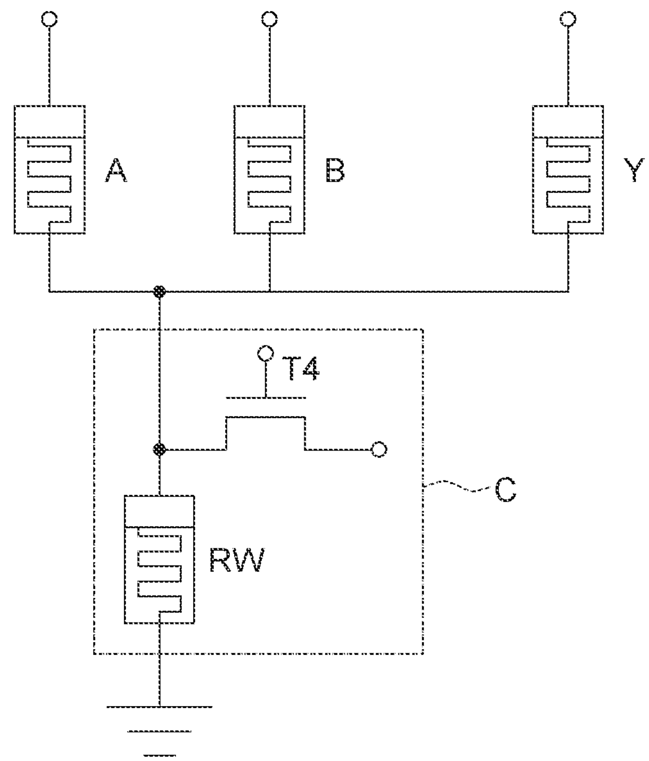

In FIG. 3C, the conductance controllable unit C includes a resistive switch RW and a transistor T4. The transistor T4 provides a voltage or a current to control the conductance of the resistive switch TW. Similarly, during the logic operation, the transistor T4 is turned off.

Figure 3D:
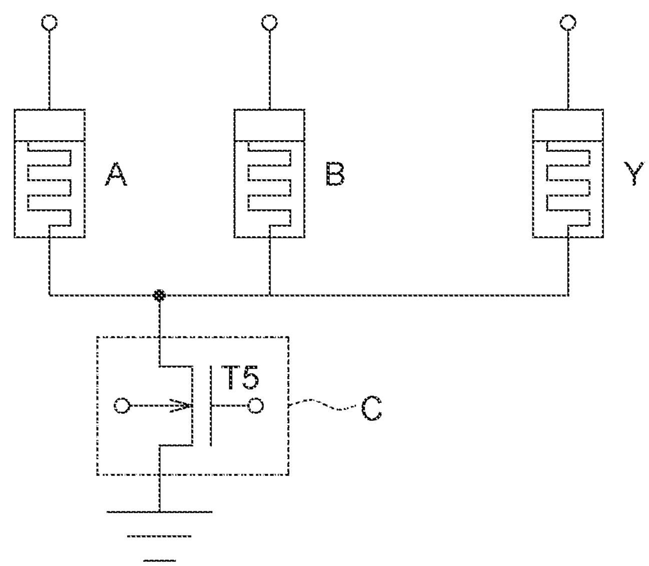

In FIG. 3D, the conductance controllable unit C includes a multi-terminal transistor T5, wherein one terminal of the multi-terminal transistor T5 is not necessary to be grounded.

Figure 3E:
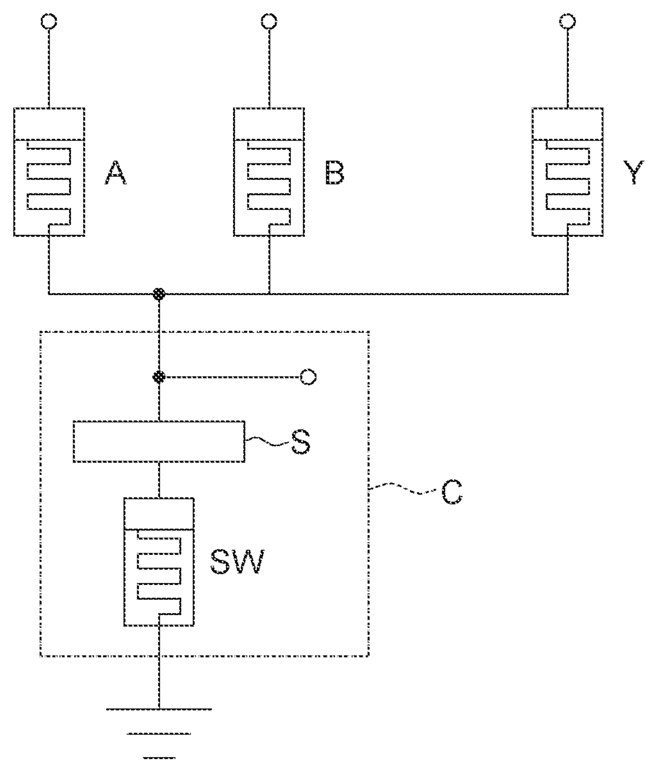

In FIG. 3E, the conductance controllable unit C includes a resistive switch RW and a cascaded selector S. In one embodiment of the application, the selector S may be implemented by a unipolar diode, a bipolar diode, an OTS, a metal-insulator-metal film (the insulator may be $Al_2O_3$, a transition metal oxide and so on), a metal-insulator-transition material (VOx, NbOx and so on).

From FIG. 3A to FIG. 3E, in one embodiment of the application, the conductance controllable unit C may be volatile or non-volatile. The conductance controllable unit C may be a single transistor, a floating-gate transistor, a Ferroelectric RAM (FeRAM or FRAM).

Further, in one possible embodiment of the application, the conductance controllable unit C may be a two-terminal element or a multi-terminal element having one terminal not necessary to be grounded.

Figure 4:
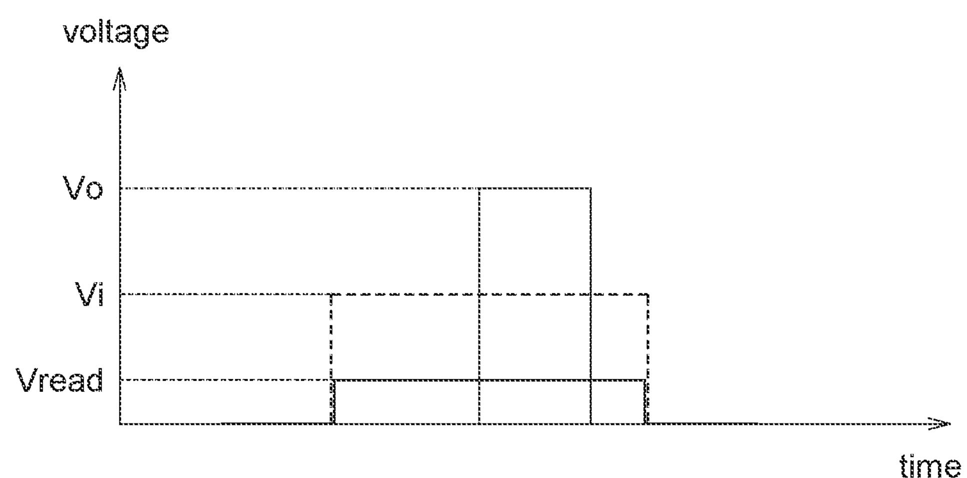
FIG. 4 shows a voltage waveform according to one embodiment of the application.

FIG. 4 shows a voltage waveform according to one embodiment of the application. In FIG. 4, "Vread" refer to the read voltage applied to the word lines WL1 to WL3 in reading the resistive switch Y. The pulse width of the input voltage Vi is large enough to charge the bit line BL while the output voltage Vo is applied within the time duration of the input voltage Vi. The read voltage Vread and the input voltage Vi are small enough to prevent the resistive switches A, B and Y from altering its state.

In one possible embodiment of the application, the set voltage VSET may be within 0.5V to 3V; the input voltage Vi may be within 0.1V to 2V; the output voltage Vo may be within 0.3V to 5V; and the read voltage Vread may be within 0.02V to 1V. This is for example but not to limit the application.

Figure 5:
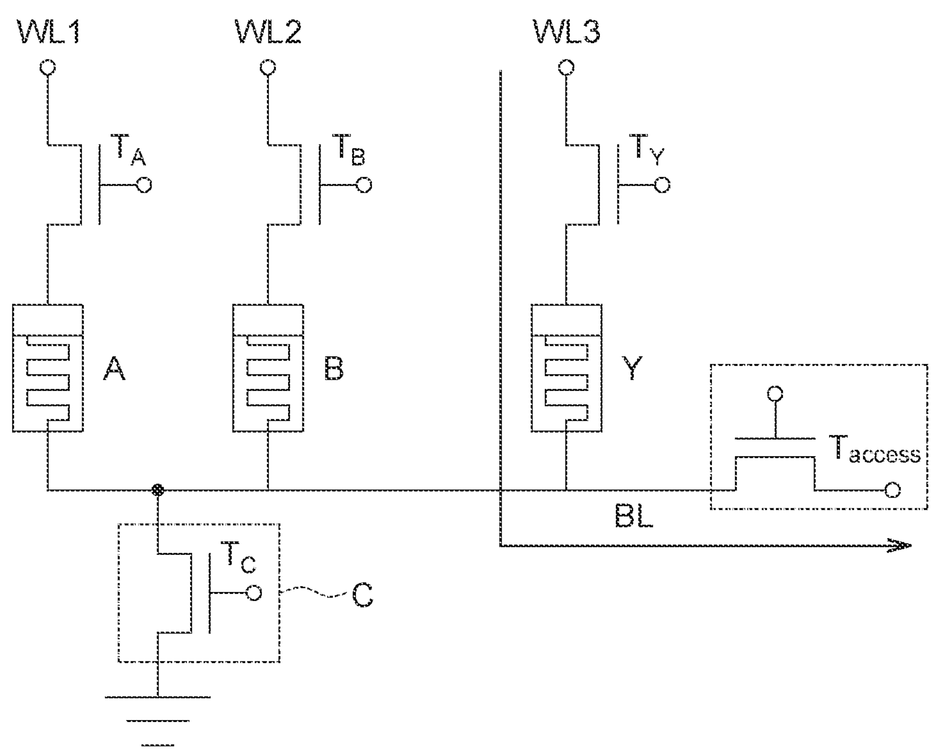
FIG. 5 shows a circuit structure of the logic operation unit of the memory device according to one embodiment of the application.

FIG. 5 shows a circuit structure of the logic operation unit of the memory device according to one embodiment of the application. In FIG. 5, the logic operation unit further including transistors $T_A$, $T_B$ and $T_Y$. The transistor $T_A$ is coupled between the word line WL1 and the resistive switch A. The transistor $T_B$ is coupled between the word line WL2 and the resistive switch B. The transistor $T_Y$ is coupled between the word line WL3 and the resistive switch Y. The conductance controllable unit C is implemented by a transistor Tc.

In below, an example for performing NOR logic operation on logic states of the resistive switches A and B (Y=NOR (A,B)) is described, wherein A=1 and B=0.

Figure 6:
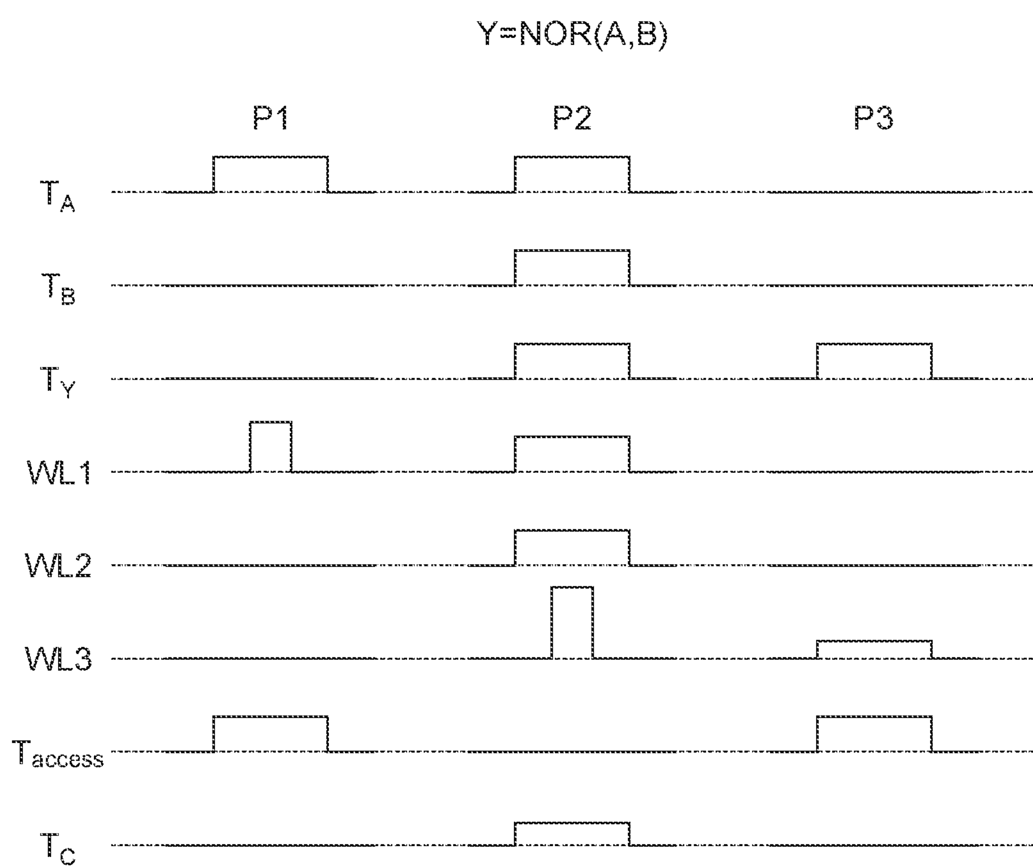
FIG. 6 shows signal waveform in performing NOR operation.

FIG. 6 shows signal waveform in performing NOR operation.

In FIG. 6, during the phase P1, the transistor $T_A$ is conducted while high level voltage is applied on the word line WL1 to program the resistive switch A (A=1); the transistor $T_B$ is disconnected to prevent programming the resistive switch B (B=0); and the transistor $T_Y$ is disconnected but the access transistor Taccess is conducted to charge the bit line BL.

In the phase P2, the transistors $T_A$, $T_B$ and $T_Y$ are conducted, the high-level voltages are applied to the word lines WL1 to WL3 and the initial conductance of the conductance controllable unit C is set as low conductance for performing NOR logic operation. Further, in the phase P2, the resistive switch Y is Y=NOR(A, B)=NOR(1, 0)=0.

In the phase P3, the resistive switch Y is read. Thus, during the phase P3, the transistors $T_A$ and $T_B$ are disconnected while the transistors $T_Y$ and Taccess are conducted; the conductance of the conductance controllable unit C is set as high conductance $G_L(G_L >> G_{HRS})$; and a small read voltage is applied to the word line WL3 to read the current via the transistor Taccess and to read out the logic state of the resistive switch Y.

In one embodiment of the application, the logic operation units may be extended by adding more resistive switches for executing user-defined logic operation. In here, the logic operation $Y=(\overline{A}B+A\overline{B})S$ is as an example but the application is not limited by this.

Figure 7A:
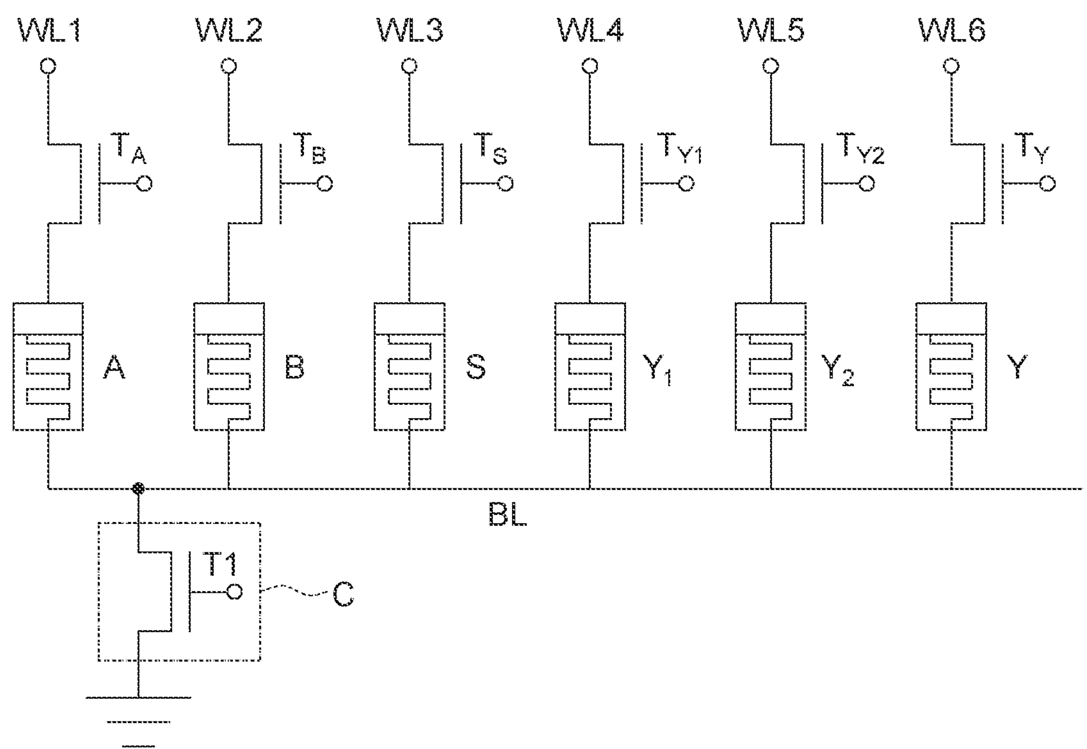
FIG. 7A shows circuit diagram of the logic operation unit for executing the logic operations $Y=(\overline{A}B+A\overline{B})S$.
Figure 7B:
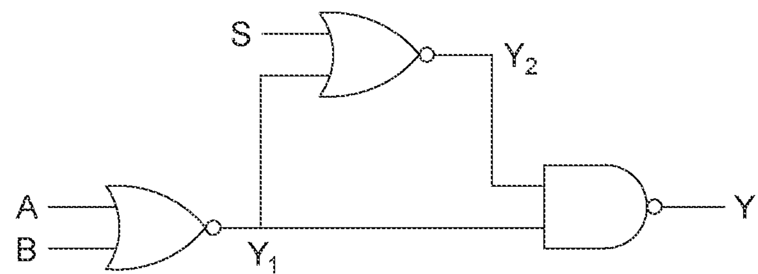
FIG. 7B shows the logic gates for executing the logic operations $Y=(\overline{A}B+A\overline{B})S$.
Figure 7C:
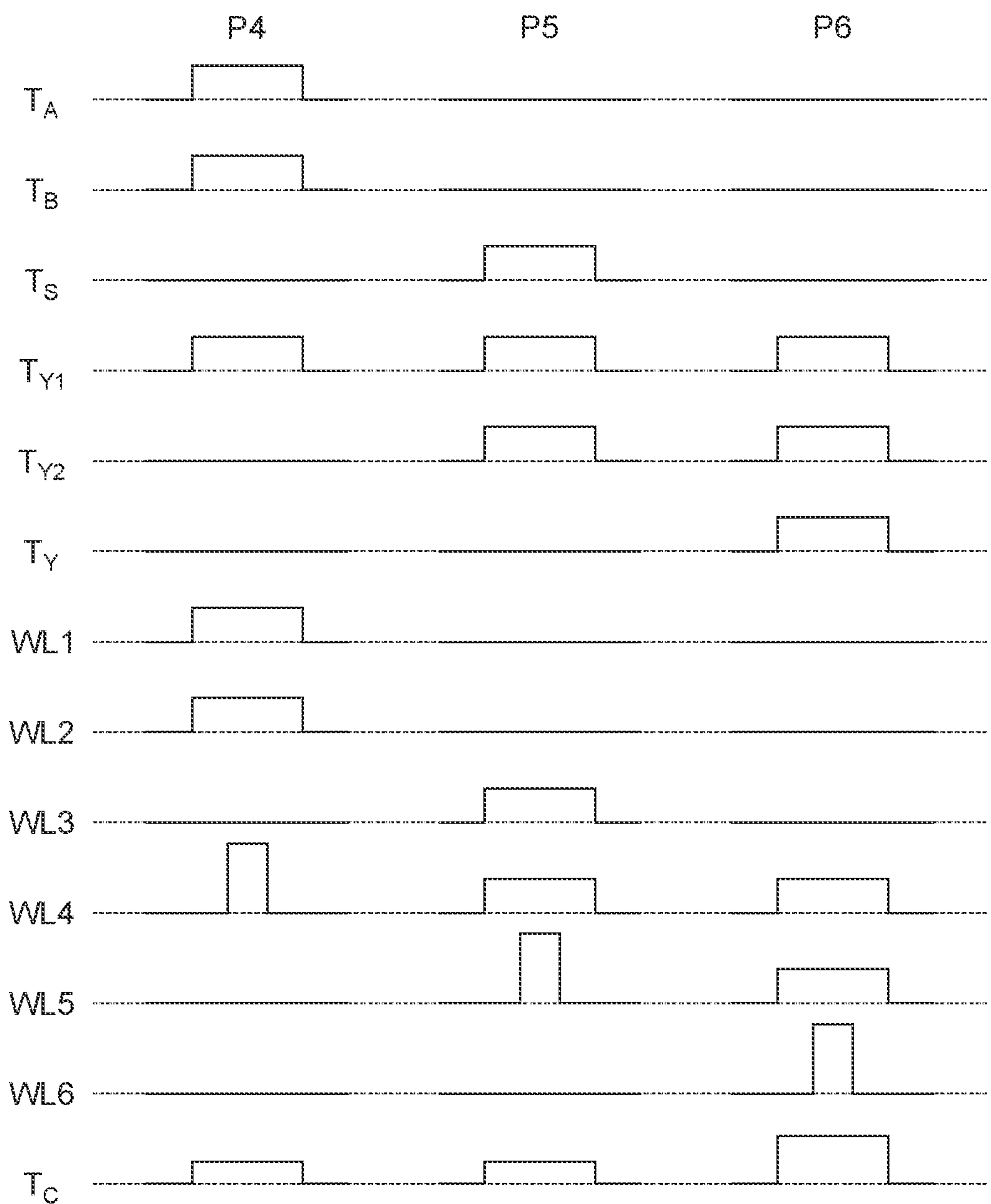
FIG. 7C shows the signal waveform for executing the logic operations $Y=(\overline{A}B+A\overline{B})S$.

FIG. 7A shows circuit diagram of the logic operation unit for executing the logic operations $Y=(\overline{A}B+A\overline{B})S$; FIG. 7B shows the logic gates for executing the logic operations $Y=(\overline{A}B+A\overline{B})S$; and FIG. 7C shows the signal waveform for executing the logic operations $Y=(\overline{A}B+A\overline{B})S$. For executing the logic operations $Y=(\overline{A}B+A\overline{B})S$, the operations may include three steps. In the first step, the logic operation Y1=NOR(A, B) is performed. In the second step, the logic operation Y2=NOR(Y1, S) is performed. In the third step, the logic operation Y=NAND(Y1, Y2) is performed. In FIG. 7A, S, Y1 and Y2 are resistive switches.

In the phase P4, the transistors $T_A$, $T_B$ and $T_Y$ are conducted; high level voltages are applied to the word lines WL1, WL2 and WL4 and the conductance of the conductance controllable unit C is set as low conductance for performing NOR logic operation Y1=NOR(A, B).

In the phase P5, the transistors $T_{Y1}$, $T_{Y2}$ and $T_s$ are conducted; high level voltages are applied to the word lines WL3, WL4 and WL5; and the conductance of the conductance controllable unit C is set as low conductance for performing NOR logic operation Y2=NOR(Y1, S).

In the phase P6, the transistors $T_{Y1}$, $T_{Y2}$ and $T_Y$ are conducted; high level voltages are applied to the word lines WL4, WL5 and WL6; and the conductance of the conductance controllable unit C is set as high conductance for performing NAND logic operation Y=NAND(Y1, Y2).

By the above description, the embodiment may combine the required logic operation units to execute the user-defined logic operations.

Refer to FIG. 8A to FIG. 8G which show circuit diagrams of a memory device according to several embodiments of the application.

Figure 8A:
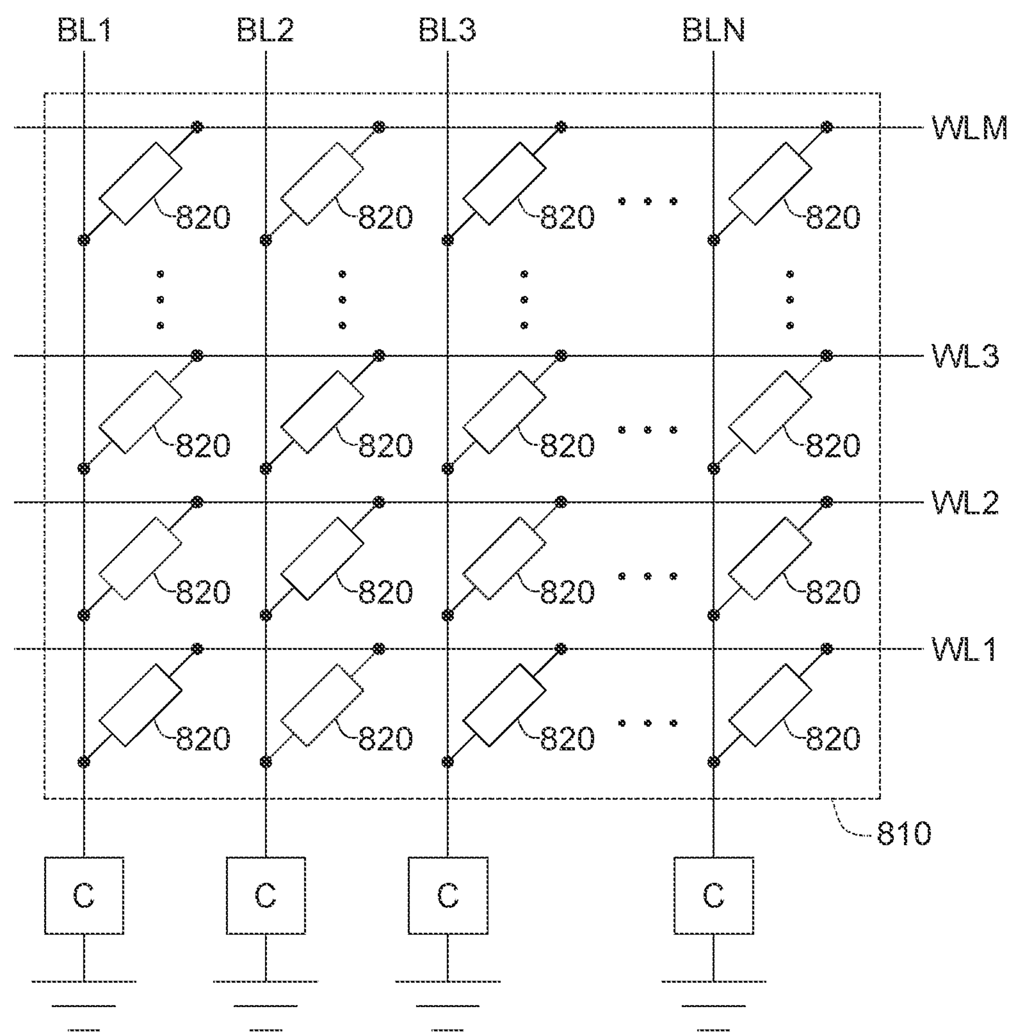
FIG. 8A to FIG. 8G show circuit diagrams of a memory device according to several embodiments of the application.

As shown in FIG. 8A, the memory device 800A includes a memory array 810, a plurality of bit lines BL1~BLN (N being a positive integer), a plurality of word lines WL1~WLM (M being a positive integer) and at least one conductance controllable unit C. The memory array 810 is coupled to the bit lines BL1~BLN, the word lines WL1~WLM and the at least one conductance controllable unit C. The memory array 810 includes a plurality of memory cells 820, wherein the memory cells 820 may be implemented by the resistive switches (for example but not limited by, the resistive switches A, B and Y) in the above embodiments. That is, a memory cell group (for example but not limited by, the resistive switches A, B and Y) of the memory cells 820 and the at least one conductance controllable unit C form a logic operation unit. Or, in other possible embodiment of the application, each of the memory cells 820 may be implemented by a serial connection of the resistive switches (A, B and Y) and a selector/a transistor. In FIG. 8A, a plurality of control lines (not shown) for controlling the selector and/or the transistor of the memory cells 820 are parallel to the bit lines BL1~BLN or parallel to the word lines WL1~WLM, to form a semi-crossbar array.

Figure 8B:
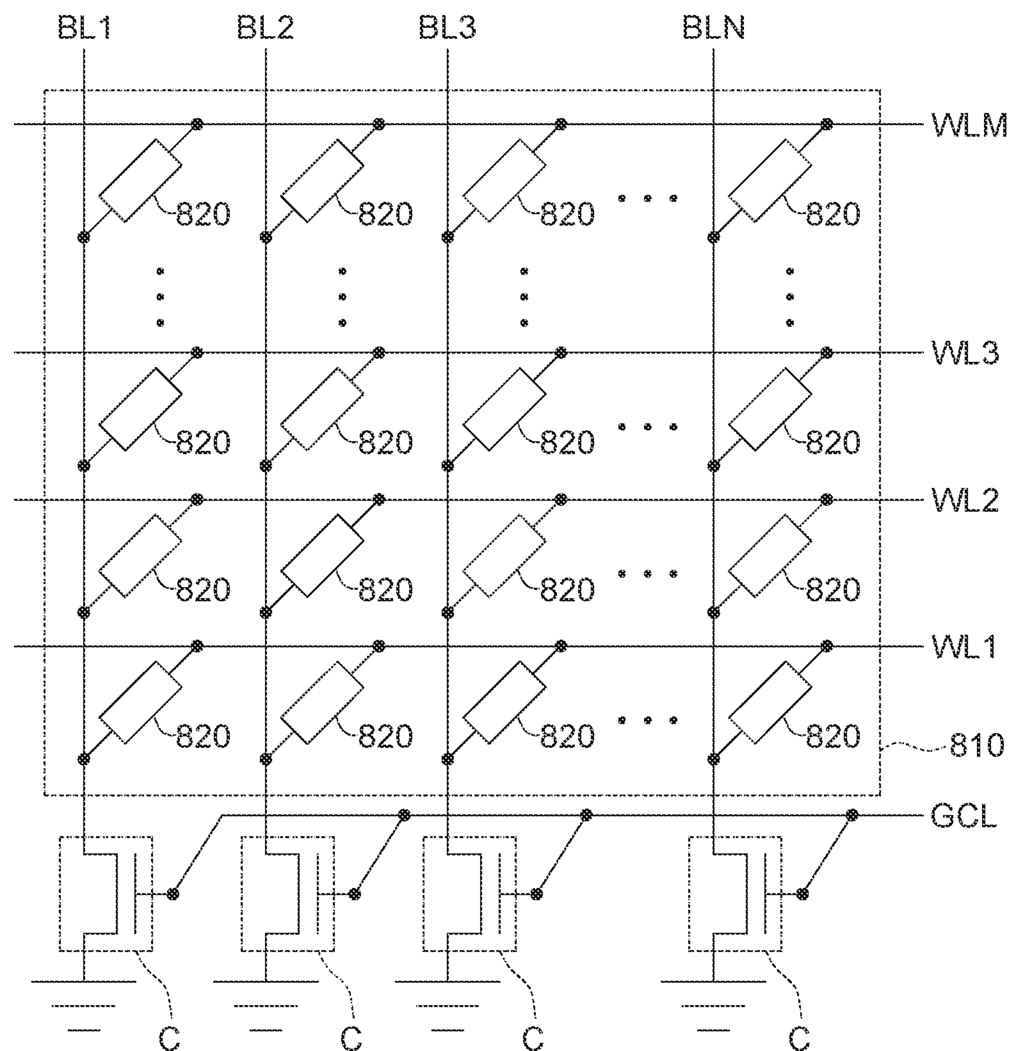

As shown in FIG. 8B, the memory device 800B includes the memory array 810, the bit lines BL1~BLN, the word lines WL1~WLM and the at least one conductance controllable unit C. In FIG. 8B, the conductance values of the conductance controllable units C are controlled by a single conductance control line GCL for synchronically tuning the conductance values of the conductance controllable units C; and the conductance control line GCL is parallel to the bit lines BL1~BLN or parallel to the word lines WL1~WLM, to form a semi-crossbar array.

Figure 8C:
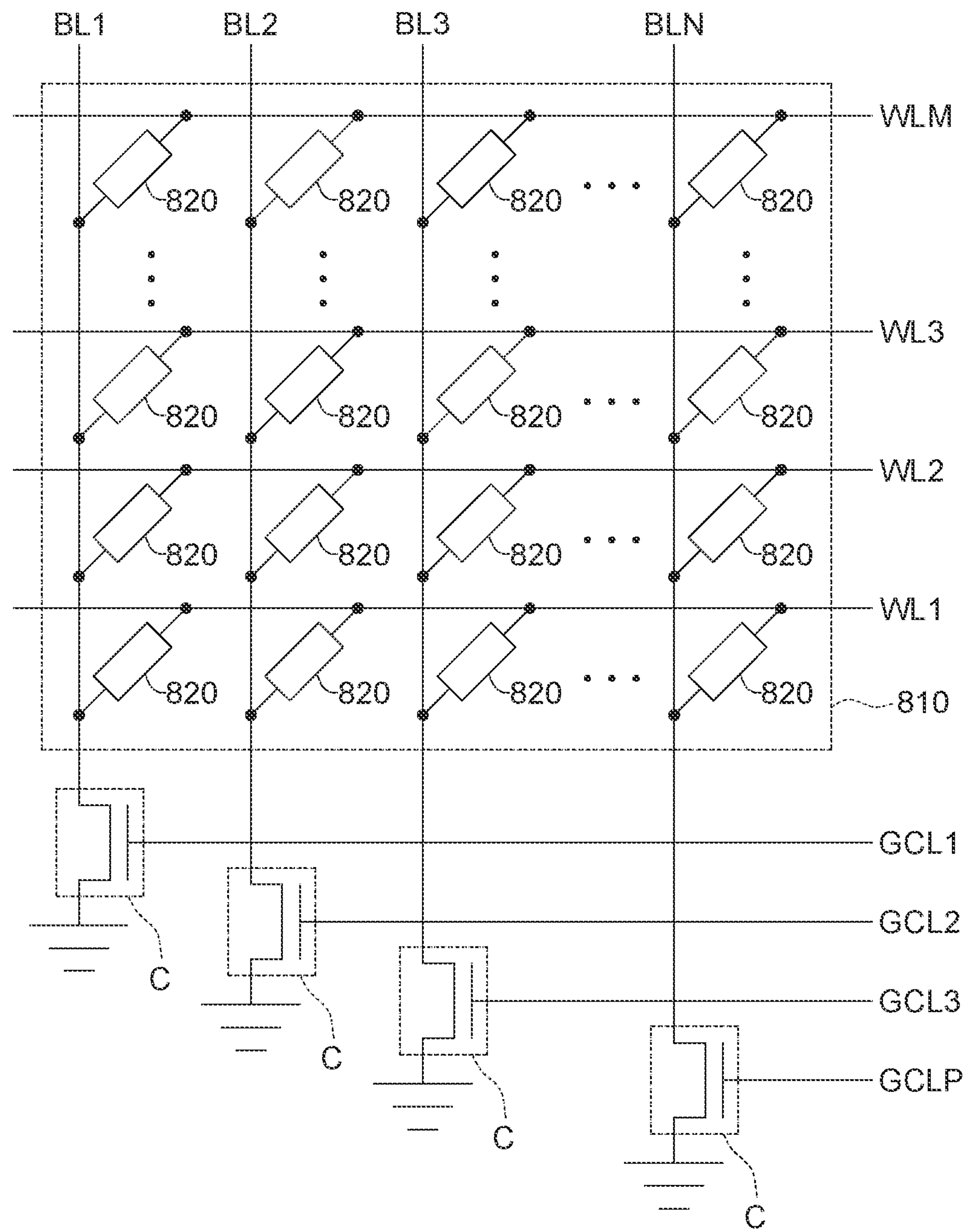

As shown in FIG. 8C, the memory device 800C includes the memory array 810, the bit lines BL1~BLN, the word lines WL1~WLM and the at least one conductance controllable unit C. In FIG. 8C, the conductance control lines GCL1~GCLP (P being a positive integer) for controlling the conductance values of the conductance controllable units C are independent (i.e. not coupled together) for independent tuning the conductance of the conductance controllable units C; and the conductance control lines GCL1~GCLP are parallel to the bit lines BL1~BLN or parallel to the word lines WL1~WLM, to form a semi-crossbar array.

Figure 8D:
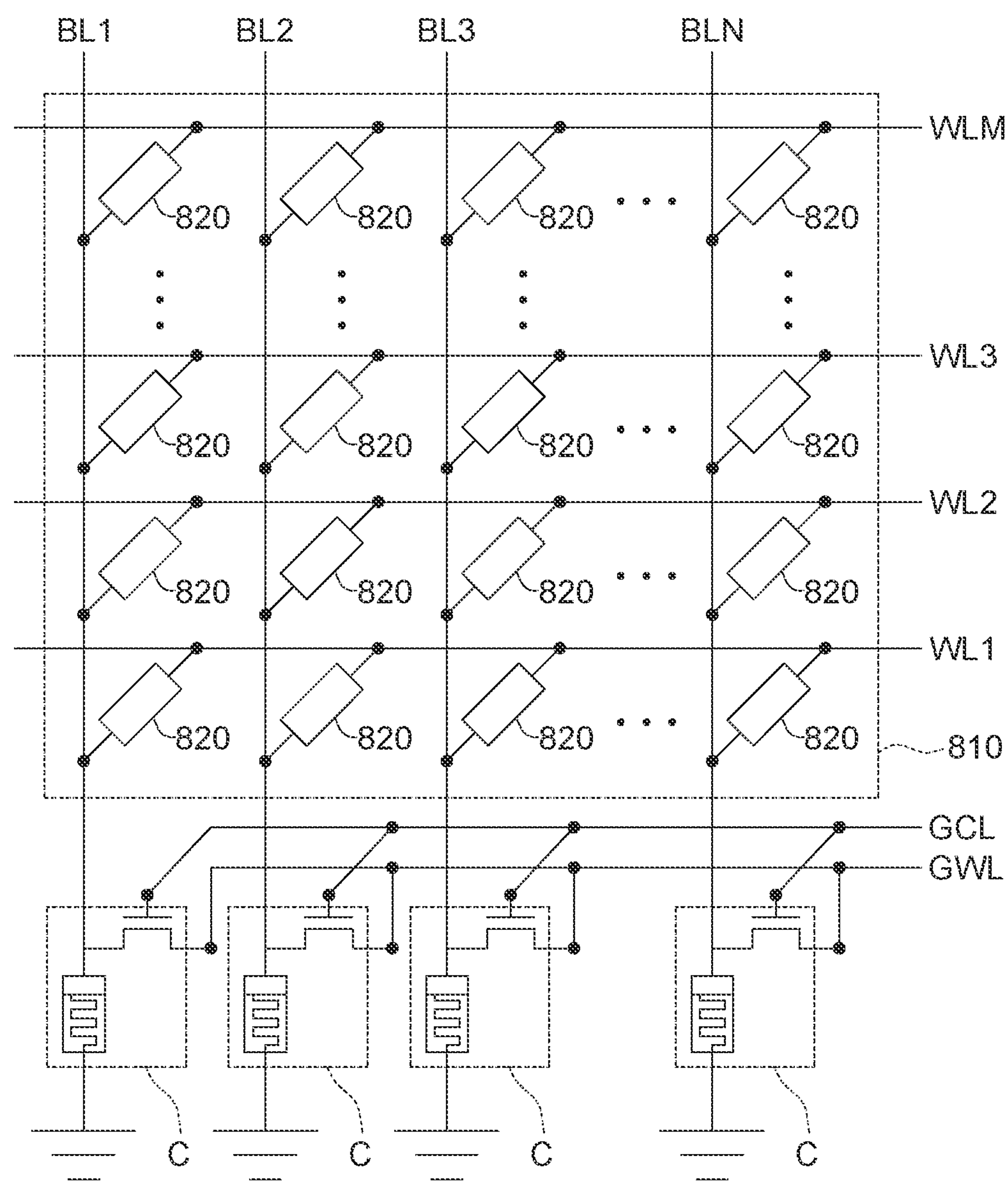

As shown in FIG. 8D, the memory device 800D includes the memory array 810, the bit lines BL1~BLN, the word lines WL1~WLM and the at least one conductance controllable unit C. In FIG. 8D, the conductance values of the conductance controllable units C are controlled by the conductance control line GCL for synchronically tuning the conductance values of the conductance controllable units C; and the conductance control line GCL is parallel to the bit lines BL1~BLN or parallel to the word lines WL1~WLM, to form a semi-crossbar array. Further, the memory device 800D further includes a conductance word line GWL coupled to the drains of the transistors of the conductance controllable units C; and the conductance word line GWL is parallel to the bit lines BL1~BLN or parallel to the word lines WL1~WLM.

Figure 8E:
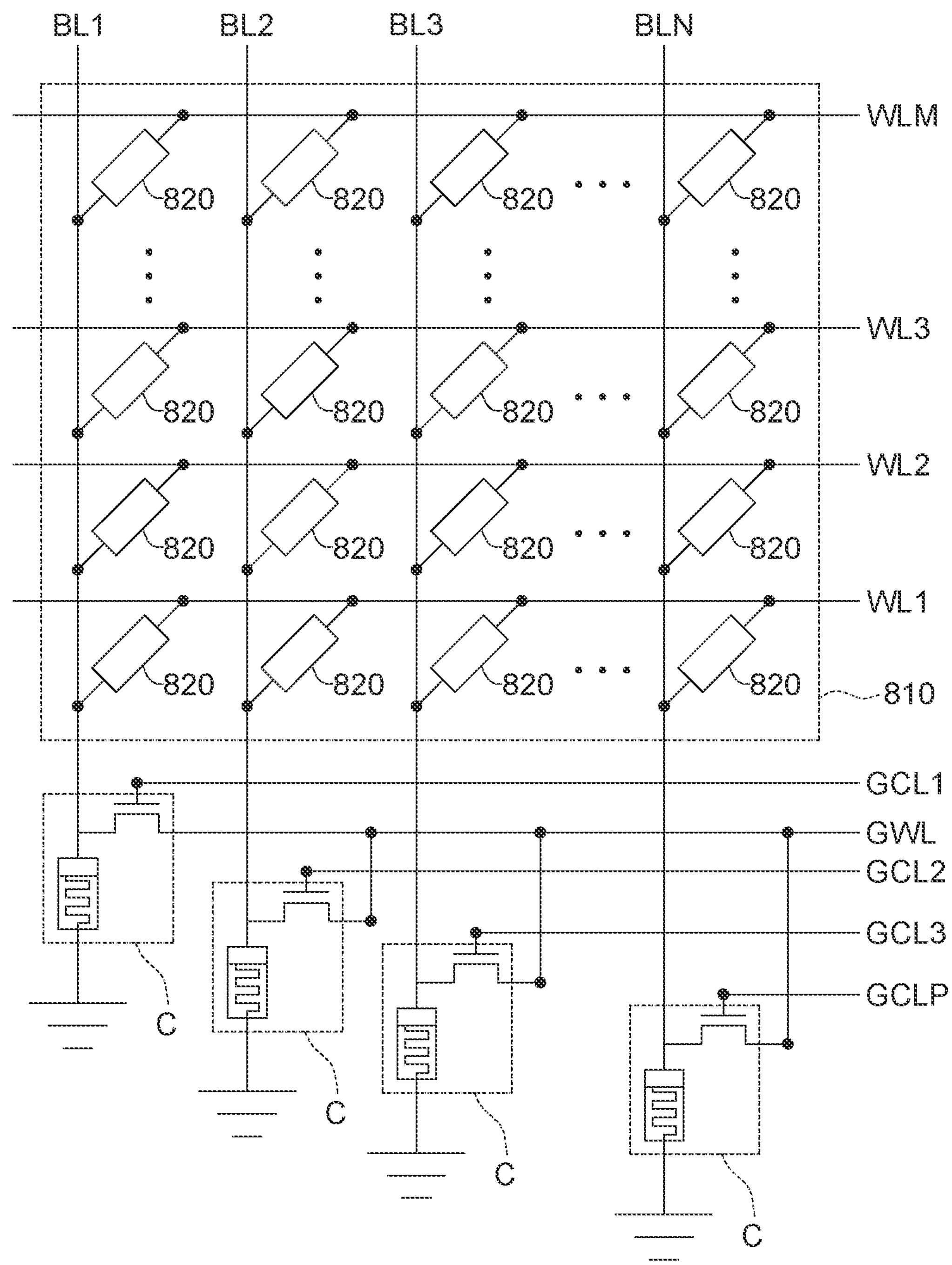

As shown in FIG. 8E, the memory device 800E includes the memory array 810, the bit lines BL1~BLN, the word lines WL1~WLM and the at least one conductance controllable unit C. In FIG. 8E, the conductance control lines GCL1~GCLP (P being a positive integer) for controlling the conductance values of the conductance controllable units C are independent (i.e. not coupled together) for independent tuning the conductance of the conductance controllable units C; and the conductance control lines GCL1~GCLP are parallel to the bit lines BL1~BLN or parallel to the word lines WL1~WLM, to form a semi-crossbar array. Further, the memory device 800E further includes a conductance word line GWL coupled to the drains of the transistors of the conductance controllable units C; and the conductance word line GWL is parallel to the bit lines BL1~BLN or parallel to the word lines WL1~WLM.

Figure 8F:
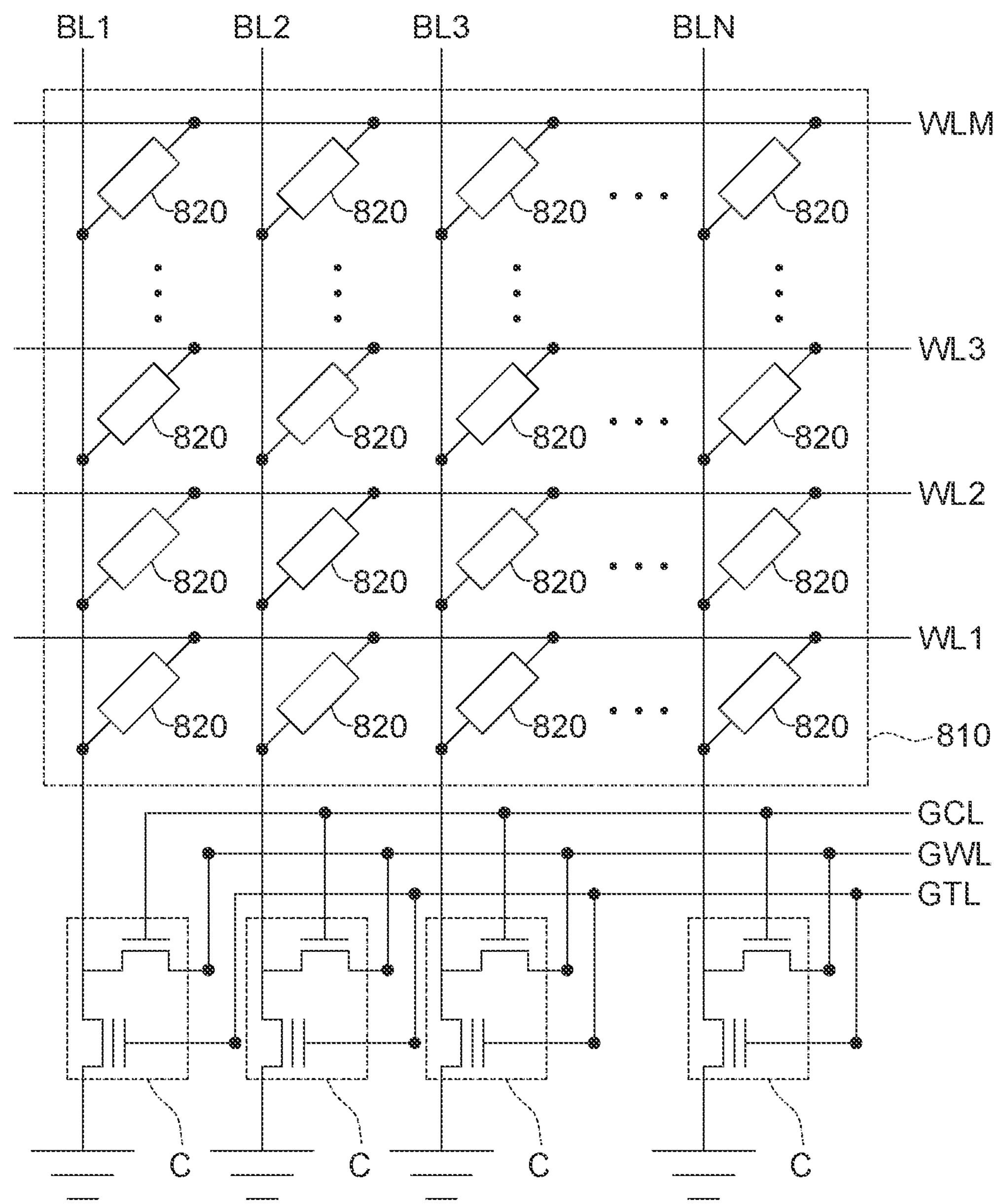

As shown in FIG. 8F, the memory device 800F includes the memory array 810, the bit lines BL1~BLN, the word lines WL1~WLM and the at least one conductance controllable unit C. In FIG. 8F, the conductance values of the conductance controllable units C are controlled by the conductance control line GCL for synchronically tuning the conductance values of the conductance controllable units C; and the conductance control line GCL is parallel to the bit lines BL1~BLN or parallel to the word lines WL1~WLM, to form a semi-crossbar array. Further, the memory device 800F further includes a conductance word line GWL coupled to the drains of the transistors of the conductance controllable units C; and the conductance word line GWL is parallel to the bit lines BL1~BLN or parallel to the word lines WL1~WLM. Further, the memory device 800F further includes a conductance tuning line GTL coupled to the gates of the floating-gate transistors of the conductance controllable units C; and the conductance tuning line GTL is parallel to the bit lines BL1~BLN or parallel to the word lines WL1~WLM.

Figure 8G:
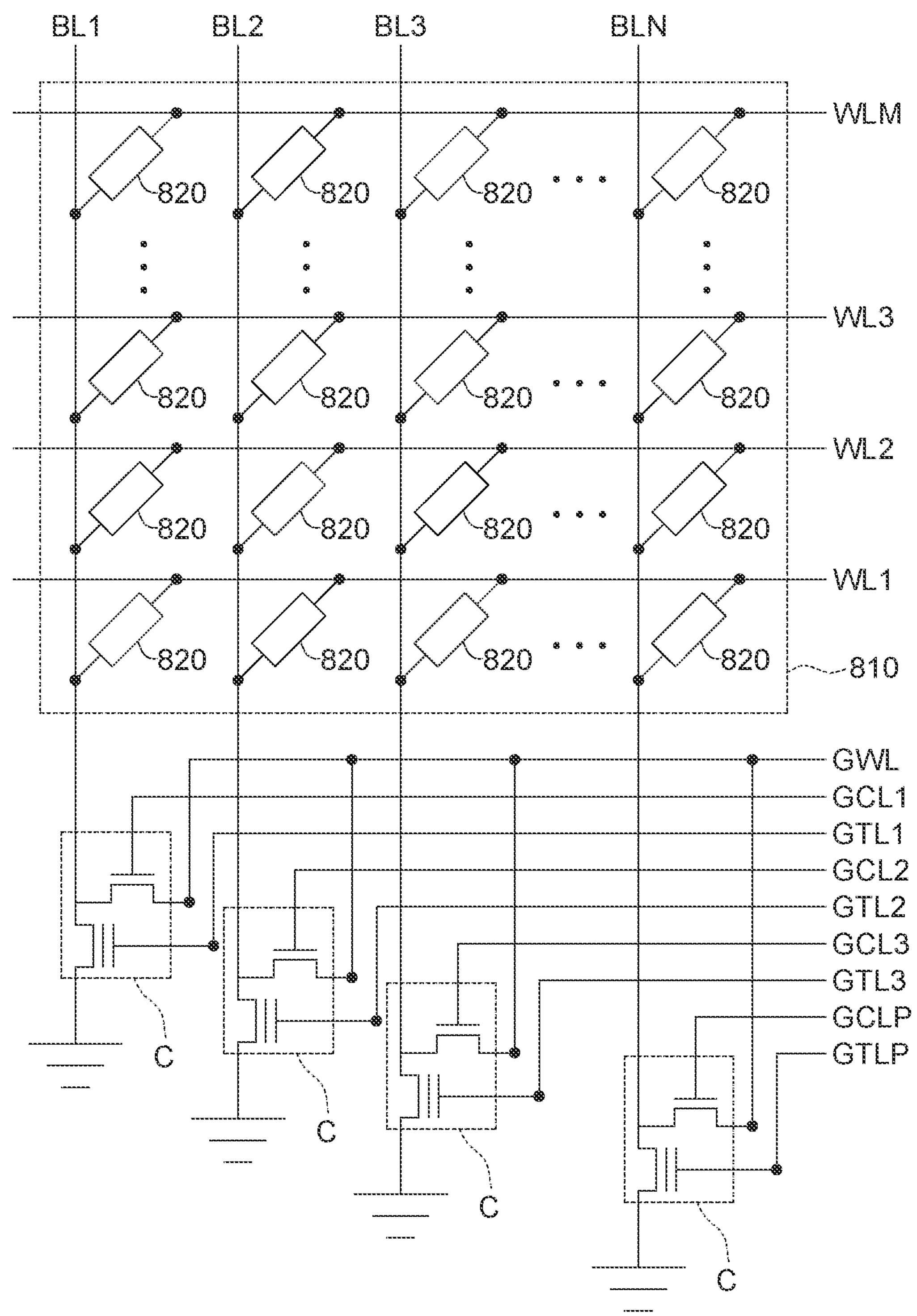

As shown in FIG. 8G, the memory device 800G includes the memory array 810, the bit lines BL1~BLN, the word lines WL1~WLM and the at least one conductance controllable unit C. In FIG. 8G, the conductance values of the conductance controllable units C are controlled by the conductance control lines GCL1~GCLP for independently tuning the conductance values of the conductance controllable units C: and the conductance control lines GCL1~GCLP are parallel to the bit lines BL1~BLN or parallel to the word lines WL1~WLM, to form a semi-crossbar array. Further, the memory device 800F further includes a plurality of conductance tuning lines GTL1~GTLP coupled to the gates of the floating-gate transistors of the conductance controllable units C; and the conductance tuning lines GTL1~GTLP are parallel to the bit lines BL1~BLN or parallel to the word lines WL1~WLM. Further, the memory device 800G further includes a conductance word line GWL coupled to the drains of the transistors of the conductance controllable units C; and the conductance word line GWL is parallel to the bit lines BL1~BLN or parallel to the word lines WL1~WLM.

In one possible embodiment of the application, the resistive switch may be implemented by resistive random-access memory (RRAM including Metal Oxide Resistive Memory (OxRAM), conductive-bridging RAM (CBRAM) and so on), phase change memory (PCM), spin-transfer Torque MRAM (STT-MRAM), spin-orbit Torque MRAM (SOT-RAM), which are still within the spirit and scope of the application.

In one possible embodiment of the application, the CIM (Computing in Memory) logic operation units may be repeatedly arranged for expanding into a large scale array. Further, the array may be two-dimension or three-dimension structure. Detail operations of the expanded array may depend on customer requirements, resistive switches (optionally including the cascading selectors or transistors) and the types of the circuit (crossbar array or semi-crossbar array), which are still within the spirit and scope of the application.

The above embodiments of the application disclose a CIM memory device and the operation thereof which uses the resistive switches as the memory cells. The logic operation functions (for example, NAND and NOR) are switched by controlling the conductance value(s) of the conductance controllable unit(s). Thus, the embodiments of the application have advantages of simplifying the calculation complexity and the peripheral circuit complexity.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A memory device comprising:

a memory array including a plurality of memory cells;

a plurality of bit lines coupled to the memory array;

a plurality of word lines coupled to the memory array; and a plurality of conductance controllable units coupled to the memory array;

wherein a memory cell group and at least one conductance controllable unit among the conductance controllable units form a logic operation unit, and a logic operation function of the logic operation unit is determined by an equivalent conductance of the at least one conductance controllable unit; and a plurality of input cells of the memory cell group of the logic operation unit store input data of the logic operation function and an output cell of the memory cell group of the logic operation unit store output data of the logic operation function.

2. The memory device according to claim 1, wherein the memory cells are a plurality of resistive switches.

3. The memory device according to claim 1, wherein the plurality of input cells of the memory cell group and the at least one conductance controllable unit form a voltage divider for determining a bit line voltage of a coupled bit line among the bit lines and for determining a logic state of the output cell of the memory cell group.

4. The memory device according to claim 1, wherein when the at least one conductance controllable unit has a first equivalent conductance, the logic operation function of the logic operation unit is a first logic operation;

when the at least one conductance controllable unit has a second equivalent conductance, the logic operation function of the logic operation unit is a second logic operation, and the first equivalent conductance is higher than the second equivalent conductance.

5. The memory device according to claim 4, wherein the first logic operation is NAND logic operation and the second logic operation is NOR logic operation.

6. The memory device according to claim 1, wherein the logic operation unit further includes an access transistor coupled to the memory cell group, for providing a reading current or a reading voltage to read a state of the output cell of the memory cell group.

7. The memory device according to claim 1, wherein the at least one conductance controllable unit is implemented by any combination of a transistor, a floating-gate transistor, a resistive switch, a multi-terminal transistor and a selector.

8. The memory device according to claim 1, wherein a plurality of control lines controlling the conductance controllable units are parallel to the bit lines or the word lines.

9. The memory device according to claim 1, wherein the conductance controllable units are synchronously controlled.

10. The memory device according to claim 1, wherein the conductance controllable units are independently controlled.

11. An operation method for a memory device, the operation method comprising:

selecting a memory cell group of a plurality of memory cells of the memory device and at least one conductance controllable unit to form a logic operation unit; and controlling an equivalent conductance of the at least one conductance controllable unit to determine a logic operation function of the logic operation unit;

wherein a plurality of input cells of the memory cell group of the logic operation unit store input data of the logic operation function and an output cell of the memory cell group of the logic operation unit store output data of the logic operation function.

12. The operation method according to claim 11, wherein the memory cells are a plurality of resistive switches.

13. The operation method according to claim 11, wherein the plurality of input cells of the memory cell group and the at least one conductance controllable unit form a voltage divider for determining a logic state of the output cell of the memory cell group.

14. The operation method according to claim 11, wherein when the at least one conductance controllable unit has a first equivalent conductance, the logic operation function of the logic operation unit is a first logic operation;

when the at least one conductance controllable unit has a second equivalent conductance, the logic operation function of the logic operation unit is a second logic operation, and the first equivalent conductance is higher than the second equivalent conductance.

15. The operation method according to claim 14, wherein the first logic operation is NAND logic operation and the second logic operation is NOR logic operation.

16. The operation method according to claim 11, wherein the logic operation unit further includes an access transistor coupled to the memory cell group, for providing a reading current or a reading voltage to read a state of the output cell of the memory cell group.

17. The operation method according to claim 11, wherein the at least one conductance controllable unit is implemented by any combination of a transistor, a floating-gate transistor, a resistive switch, a multi-terminal transistor and a selector.

18. The operation method according to claim 11, wherein the conductance controllable units are synchronously controlled.

19. The operation method according to claim 11, wherein the conductance controllable units are independently controlled.

* * * * *